Nov. 10, 1964 J. R. LIGENZA 3,156,593

FABRICATION OF SEMICONDUCTOR DEVICES

Filed Nov. 17, 1961 4 Sheets-Sheet 1

INVENTOR
J. R. LIGENZA
BY George S. Indig
ATTORNEY

Nov. 10, 1964 J. R. LIGENZA 3,156,593

FABRICATION OF SEMICONDUCTOR DEVICES

Filed Nov. 17, 1961 4 Sheets-Sheet 2

INVENTOR
J. R. LIGENZA
BY
ATTORNEY

Nov. 10, 1964 J. R. LIGENZA 3,156,593

FABRICATION OF SEMICONDUCTOR DEVICES

Filed Nov. 17, 1961 4 Sheets-Sheet 3

INVENTOR
J. R. LIGENZA
BY
ATTORNEY

INVENTOR
J. R. LIGENZA
BY George S. Indig
ATTORNEY

United States Patent Office 3,156,593
Patented Nov. 10, 1964

3,156,593

FABRICATION OF SEMICONDUCTOR DEVICES

Joseph R. Ligenza, Westfield, N.J., assignor to Bell Telephone Laboratories, Incorporated, New York, N.Y., a corporation of New York Filed Nov. 17, 1961, Ser. No. 153,049
7 Claims. (Cl. 148—187)

Figure 1A:
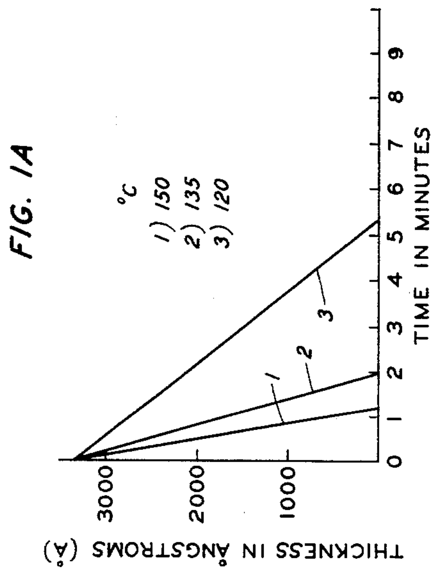
Figure 1B:
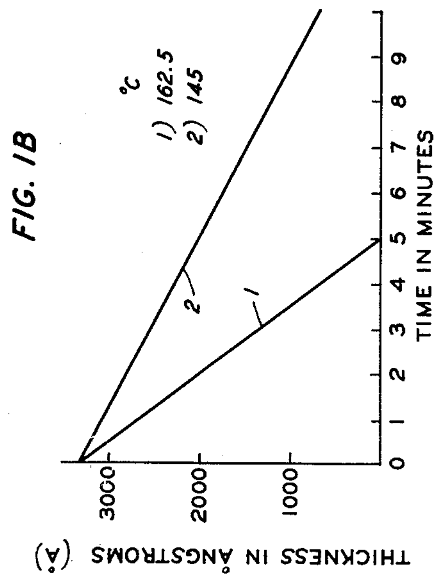
Figure 1C:
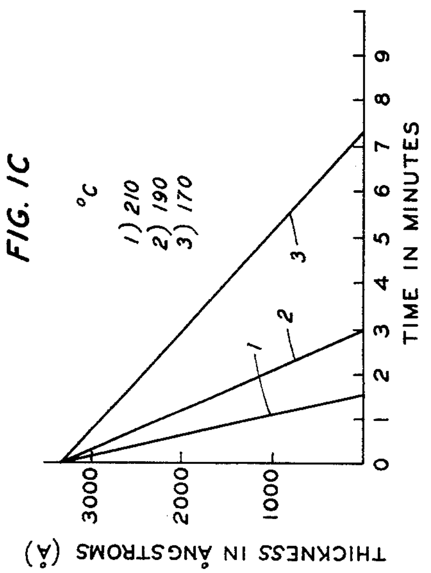
Figure 1D:
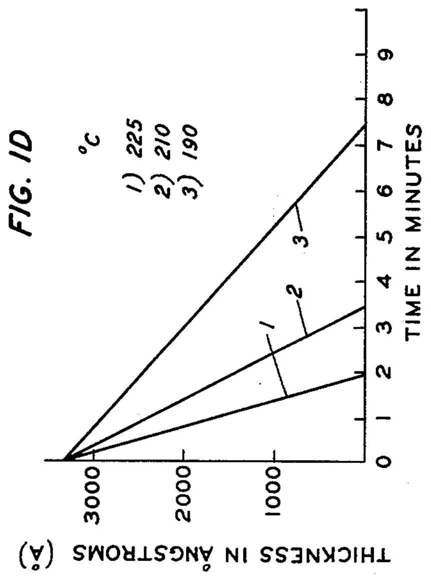
Figure 2B:
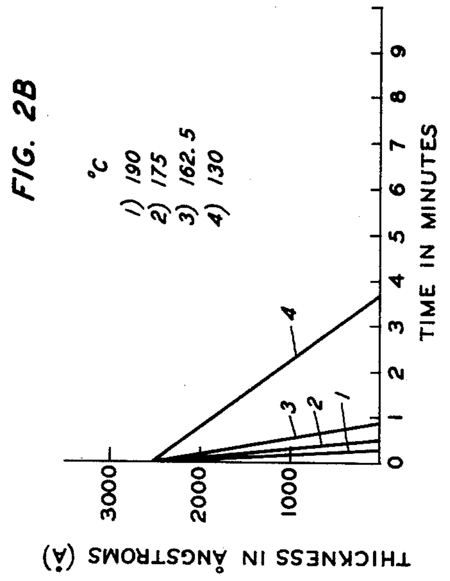
Figure 2D:
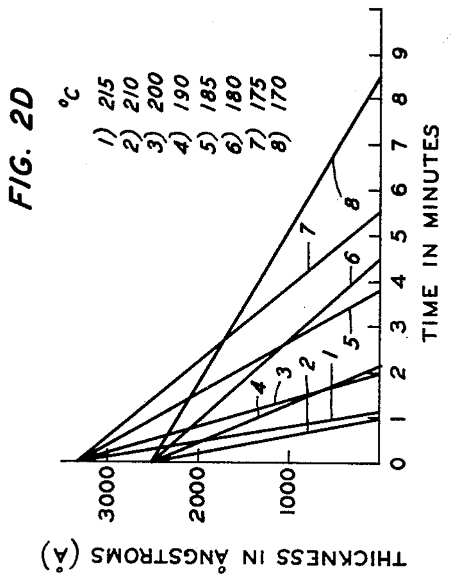
Figure 2A:
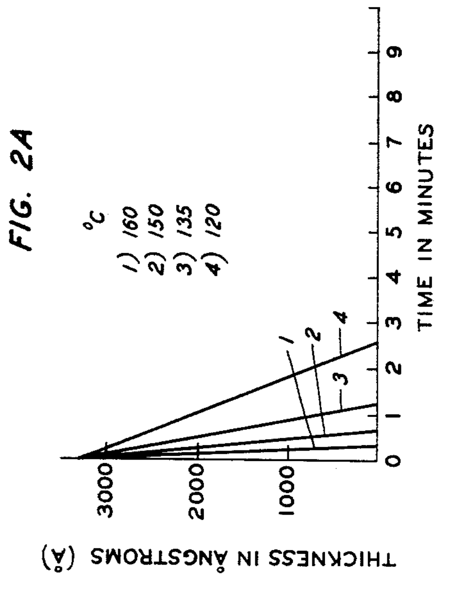
Figure 2C:
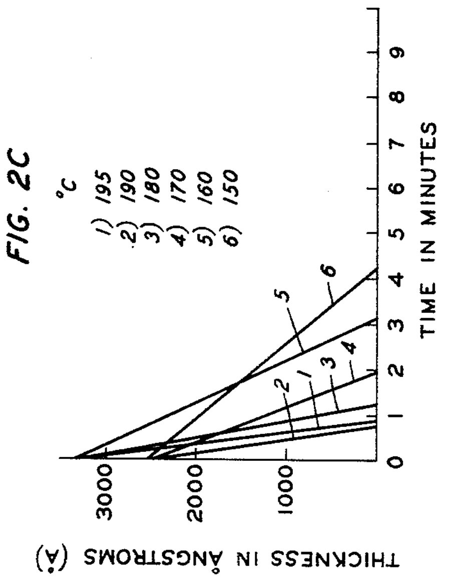

This invention relates to a method for forming precise oxide patterns on semiconductive bodies, and in particular to processes for treating silicon bodies which include the method of producing precise oxide patterns on the bodies.

The selective impurity diffusion of silicon bodies by means of an oxide mask on the surfaces thereof is now a common technique in the art. Patent 2,802,760, issued August 13, 1957, discloses the process of oxidizing a silicon surface, selectively removing the oxide film from the surface and subsequently exposing the surface to vapors, including a conductivity-type determining impurity. Diffusion is brought about by heating. The oxide layer, depending upon its thickness and the type of impurity diffusant used, inhibits diffusion into the silicon substrate. The impurity diffusion is thus limited to the unmasked areas, and a semiconductive device is produced having a plurality of conductivity-type regions differing from the original material. By the use of successive masking and diffusing steps, a diffused structure having complex arrangements of differing conductivity-type regions is formed.

Typically, the oxide mask patterns are formed by the conventional photo-mechanical etching process. Because of the non-selective etching action of conventional etchants on both the oxide layer and the photo-resist coating, a limit is placed on ultimate delineation. For example, many diffused bodies require separations between differing conductivity-type regions of four mils or less.

In accordance with the instant invention, discrete oxide areas are removed from a silica surface by etching the surface with a solid alkali hydroxide selected from the group consisting of sodium hydroxide, potassium hydroxide, rubidium hydroxide, and cesium hydroxide. Although not so restricted, advantageous use is made of the precise masking techniques of the vacuum deposition art to apply the alkali in precise patterns on the silica surface. Reaction of the alkali and the silica under controlled temperature conditions results in a water-soluble silicate reaction product subsequently removed from the surface by a water rinse.

The use of a solid alkali precludes any significant spreading of the alkali from the site of original application, thereby making possible etch patterns of excellent definition. A multiplicity of patterns can be formed on a silica surface with adjoining patterns being as close as four mils or less. Accordingly, complex arrangements of differing conductivity-type regions in the silicon body are readily formed by subsequent vapor diffusion steps.

Figure 3:
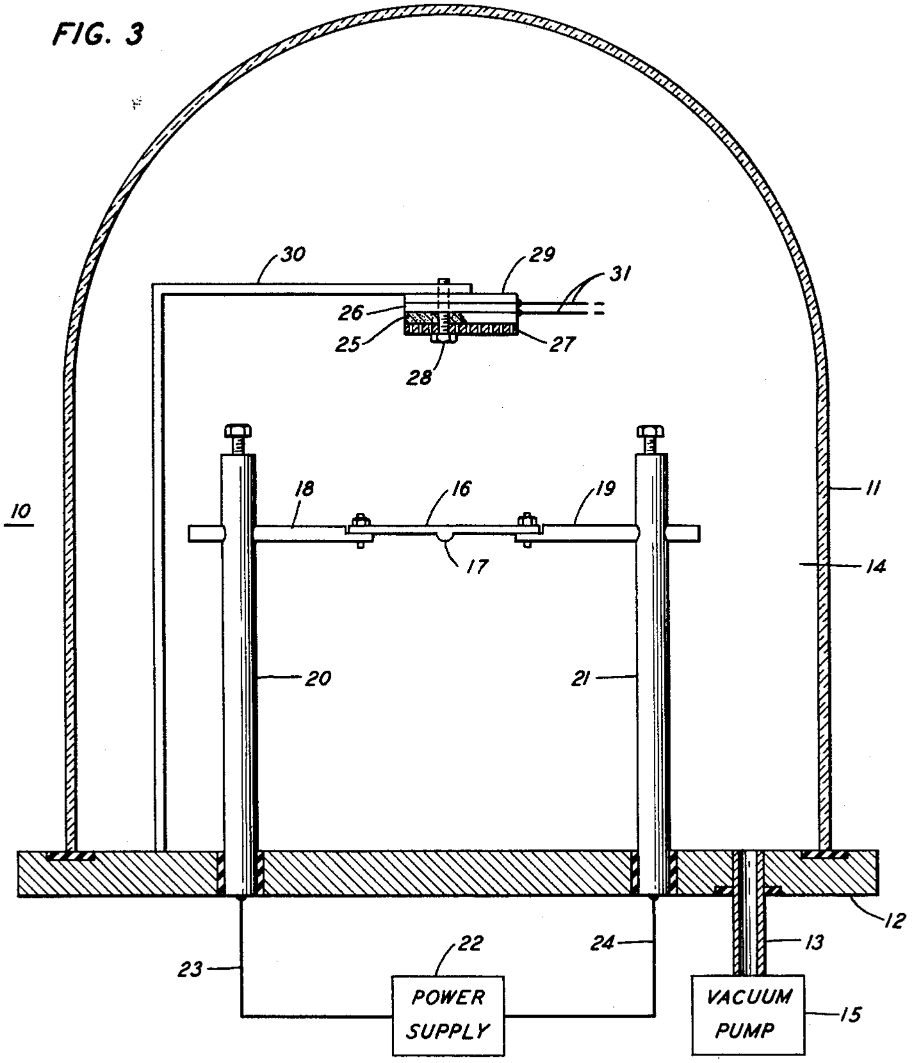

The invention may be more easily understood by reference to the drawing, in which:

FIG. 1A through FIG. 1D, on coordinates of silica film thickness in angstroms (A.) and time in minutes, are plots showing the silica etching rates of the hydroxides of the invention at various temperatures in a dry ambient;

FIG. 2A through FIG. 2D, on coordinates of silica film thickness in angstroms (A.) and time in minutes, are plots showing the silica etching rates of the hydroxides of the invention at various temperatures in a wet ambient;

FIG. 3 is a schematic front elevation view, partially in section, of a deposition apparatus suitable for applying the hydroxides of the invention in precise patterns on a silica substrate; and FIG. 4A through FIG. 9A depict, in perspective, the processing of a silicon wafer in accordance with one method of the invention, FIG. 4B through FIG. 9B being corresponding cross-sectional views of the same silicon wafer.

Referring again to FIGS. 1A, 1B, 1C, and 1D, there is depicted the silica etching rates of sodium hydroxide, potassium hydroxide, rubidium hydroxide, and cesium hydroxide, respectively, at various temperatures in a dry atmosphere. FIGS. 2A, 2B, 2C, and 2D depict the silica etching rates of the same respective hydroxides at various temperatures in a wet atmosphere (100 percent relative humidity). Since all curves in these figures are linear, the silica etching rates of the hydroxides are seen to be independent of time. Since etching proceeds at a constant rate, the depth of etching is easily controlled. One advantage therefore accruing to the process of the invention is the ability to minimize attack of the silicon substrate by the enumerated etchants.

A comparison of the figures shows that the etching rates of the hydroxides are ambient dependent, with the fastest rates occurring at 100 percent relative humidity. As further seen, the etching rates are temperature dependent and increase with temperature. Practical considerations dictate a minimum etching temperature of approximately 90 degrees centigrade. At this temperature, the rates are sufficiently fast to be of commercial value. The maximum etching temperature is determined by the melting points of the hydroxides: namely, 318.4° C., 360.4° C., 300° C., and 272.3° C. for sodium hydroxide, potassium hydroxide, rubidium hydroxide, and cesium hydroxide, respectively. To realize the advantages of the solid-solid reaction between the hydroxides of the invention and the silica, the maximum temperatures utilized in the instant process are accordingly less than the above-enumerated temperatures.

The data depicted in FIGS. 1A through 1D and 2A through 2D was obtained in the following manner. Two silicon bars 3.5 x 0.6 x 0.1 $cm.^3$ in dimension were oxidized in oxygen at 920° C. One oxide film was 2550 A. thick, the other, 3360 A. thick. A small crystal of reagent grade hydroxide, approximately 200 milligrams, was placed on a sheet of mica and exposed to room air. In a short while, the hydroxide deliquesced and provided a saturated solution. A small droplet of this solution was picked up on a platinum wire and transferred to the surface of one of the oxidized bars. In this manner, droplets 1.0 to 1.5 mm. in diameter were applied to the silica surface. The silicon bar was then transferred to a hot plate maintained at a selected temperature. A Pyrex chimney enclosed the plate and was provided with an inlet for argon gas. The argon had been previously passed through a bubbler filled with water and kept at room temperature to provide a moist ambient, or through a drying column filled with Anhydrone for a dry ambient. Accurate temperature control was maintained by attaching a thermocouple to the surface of a silicon bar identical in dimensions to the oxidized bar. This thermocouple assembly was kept in the center of the hot plate adjacent to the silicon bar to be etched.

When the water evaporated, leaving solid hydroxide on the bar, a stop watch was started. After a measured time the etched bar was transferred from the hot plate to a silver cooling block and the watch was stopped. After cooling to room temperature, the bar was rinsed with distilled water to remove the formed silicate and any remaining hydroxide. The interference color thickness of the etched spot was calculated in accordance with the procedure described by Constable in the Proceedings of the Royal Society, A115, 570 (1927), using a refractive index of 1.46 for silica. The calculated thickness was plotted against etching time. The kinetic curves of FIGS. 1A through 1D and 2A through 2D for a particular hydroxide under identical temperature and ambient conditions were constructed by using a fresh surface and extending the etching time, or by using one spot on the surface a number of times. For both procedures, results were identical within experimental error. A series of such experiments were done for each hydroxide at various temperatures and ambient conditions to obtain the data plotted in these figures.

Although use was made of an argon atmosphere in obtaining the experimental results, the invention is not so limited. Most conventional atmospheres are suitable providing they are inert with respect to the oxide mask and the hydroxides of the invention. The use of a fluorine reducing atmosphere is avoided in view of its attack on the oxide mask, such attack minimizing the effectiveness of the subsequent selective diffusion step. Also, those atmospheres that react with the hydroxides to form precipitates are not desirable. For example, carbon dioxide and chlorine react with the hydroxides to form carbonate and chloride precipitates. Such precipitates, in addition to being difficult to remove from the substrate, interfere with the solid-solid reaction between the hydroxides and the silica with a resulting non-uniform etching of the silica surface.

The requisite amount of hydroxide necessary to form the desired etch pattern is determinable by the art. However, the process is sufficiently flexible to permit the use of larger quantities since any unreacted hydroxide is readily removed from the silica surface by the subsequent water rinse. For the purpose of the experiments, the etched body was rinsed after cooling to room temperature. Conversely, rinsing of the heated body, followed by a subsequent cooling step, is equally as feasible. In either case, however, the body is preferably rinsed as soon as possible after etching to minimize attack of the silicon substrate by any unreacted hydroxide. Ordinary tap water, as well as distilled water, is utilized for the rinse.

The alkalies suitable for the practice of the invention are limited to those enumerated. Other alkalies either etch too slowly to be of practical value or form reaction products with the silica that interfere with the obtaining of a uniform etch pattern.

The desired hydroxide pattern is formed on a silica surface by methods known to the art, such methods including sputtering, evaporation, and drying of a saturated hydroxide solution. However, as previously discussed, the formation of complicated hydroxide patterns on a silica surface dictates the advantageous use of the precise masking techniques of the vacuum deposition art. FIG. 3 shows a typical vacuum deposition apparatus 10 suitable for forming hydroxide patterns on a silica substrate. Apparatus 10 is defined by bell jar 11 and base member 12, typically made of steel. Port 13 communicates with vacuum chamber 14 and is attached by vacuum pump 15. Positioned within chamber 14 is evaporation boat 16 having indentation 17 for holding the alkali hydroxide. Boat 16 is supported by electrodes 18 and 19, which in turn are held by supports 20 and 21, respectively. These supports, typically made of copper, extend through and are insulated from base member 12 and make electrical contact with power supply 22 through leads 23 and 24. Provision is made in this particular apparatus for the simultaneous deposition and reaction of the hydroxide with the silica surface by the following configuration. Silicon substrate 25 having an oxide layer therein, heater element 26, and evaporation mask 27 are positioned and supported over evaporation boat 16 by arm 28 and holder 29 attached to support 30. Heater element 26, for example a molybdenum strip sandwiched between two insulating mica layers, is connected by leads 31 to an external power source. By means of element 26, substrate 25 is heated to an etching temperature determined in accordance with the previously defined considerations. Such heating permits the hydroxide evaporated from boat 16 through mask 27 to commence etching upon contacting the oxide layer.

The parameters governing vacuum evaporation have been thoroughly investigated and are well understood by the art. The following is an outline of one procedure utilized to form precise oxide patterns on a silicon substrate utilizing the deposition apparatus of FIG. 3.

A 2 cm. by ½ cm. silicon substrate previously oxidized in oxygen at 920° C. to form a 2500 A. thick oxide layer was placed between a heater element and an evaporation mask, and a molybdenum holder was placed against the heater element, as shown in FIG. 3. The configuration was then mounted on a support above a gold evaporation boat such that the substrate was positioned 6 inches above the boat and at a right angle to the axis of the indentation in the boat. The whole configuration was symmetrical with respect to the center of the vapor stream of the source material in the indentation. The heater element was a molybdenum heating strip sandwiched between two layers of mica. A one-half mil thick molybdenum mask was utilized having an array of 25 two-by-three mil rectangular holes spaced one-half mil apart. The evaporation took place in a residual atmosphere of dry nitrogen at a pressure $10^{-6}$ mm. of mercury.

The procedure was to load the indentation in the boat with reagent-grade sodium hydroxide pellets, melt the pellets and then affix the boat in position in the apparatus. The boat was then heated to a temperature of 700° C. and at the same time the substrate was heated to 200° C. The temperatures were maintained for a period of eight minutes and the apparatus then allowed to cool to room temperature. The silicon substrate was then removed from the apparatus and washed with water. Even though the etching time was of sufficient duration to cause etching of the silicon substrate, the delineation between holes in the oxide layer still matched the one-half mil delineations on the mask.

Figure 4A:
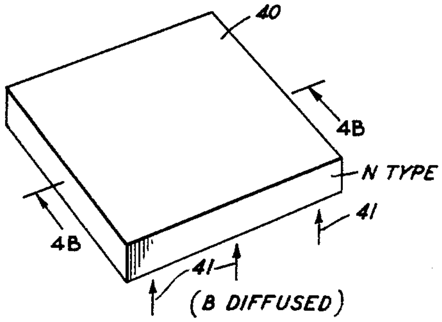
Figure 5A:
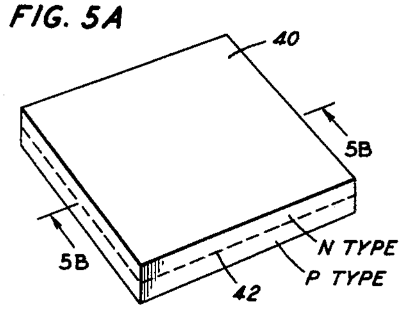
Figure 5B:
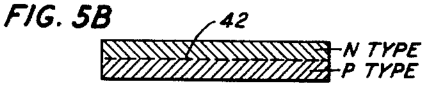
Figure 4B:
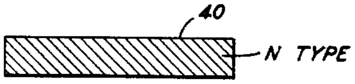

Illustrative of the advantages offered by the method of the invention is the following description taken in conjunction with FIGS. 4A and 4B through 9A and 9B of the drawing of a method used to effect localized conductivity type conversion of an n-type silicon wafer 40 of FIG. 4A. As illustrated by arrows 41 below wafer 40, the wafer was subjected to boron vapor diffusion as disclosed, for example, in Patent 2,802,760, to produce a P-N junction 42 within the wafer, as shown in FIGS. 5A and 5B. A mask was applied to all surfaces of wafer 40 except the bottom face in order to restrict the diffusion to the formation of one junction.

Figure 6A:
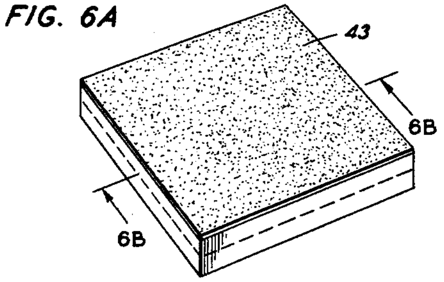
Figure 6B:
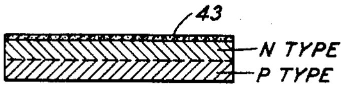
Figure 9A:
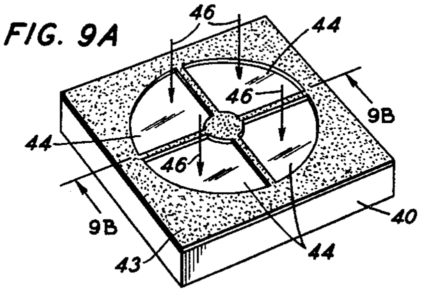

Wafer 40 was next subjected to an oxidizing treatment to produce a layer 43 of silicon dioxide on the vapor major face of the wafer, as shown in FIGS. 6A and 6B. The oxide layer 43 was produced in a variety of ways also disclosed in Patent 2,802,760. In one illustrative embodiment the layer was formed by heating the wafer to a temperature between 1100° C. and 1400° C. in an oxidizing atmosphere consisting of nitrogen as the carrier gas and water vapor as the oxidant. The oxidizing treatment was conveniently limited to the upper major face of the wafer by suitable masking arrangements. As discussed in Patent 2,802,760, the desired oxide thickness depends upon the particular diffusants to be subsequently utilized and generally exceeds 1500 A.

Figure 7A:
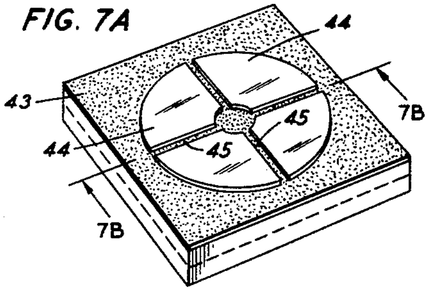
Figure 7B:
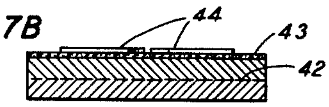

An alkali hydroxide of the invention was then applied to and reacted with discrete areas of oxide layer 43 in accordance with the procedure discussed in conjunction with FIG. 3 of the drawing. Although not necessary, the oxide layer was desirably first cleaned, for example with boiling nitric acid, to remove any impurities therein. As shown in FIGS. 7A and 7B, the hydroxide was applied to a generally circular area which was divided into quadrants 44 by slender divisions 45 having a width of as little as 0.004 inch. It is understood that divisions 45 are exposed portions of the oxide layer upon which no hydroxide has been placed.

As a result of the etching action of the hydroxide followed by a subsequent water rinse, the oxide layer on the upper face of wafer 40 was removed from the discrete areas covered by the hydroxide. The result of this treatment is the structure shown in FIGS. 8A and 8B in which the silicon substrate 40 is shown exposed in the four quadrants 44 previously covered by the hydroxide. Oxide layer 43, including divisions 45, mask those areas where impurity diffusion is not desired.

Figure 8A:
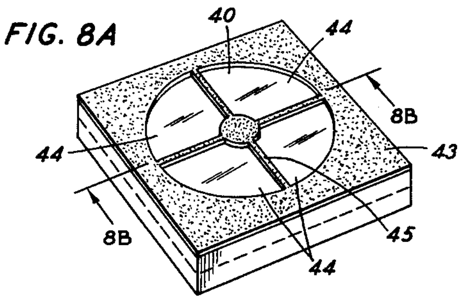
Figure 9B:
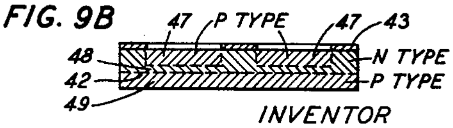
Figure 8B:
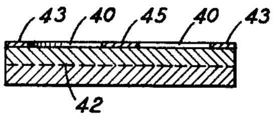

The wafer of FIGS. 8A and 8B was next subjected to diffusion treatment in a boron atmosphere in accordance with the teachings of Patent 2,802,760, referred to heretofore. During this step, vapor diffusion of boron as represented by the arrows 46 in FIG. 9A occurred over the areas 44 unprotected by the oxide layer 43. Depending upon the time and temperature used, P-type regions 47 were formed under the unprotected areas which conformed very closely to the surface configuration of those unprotected areas. As shown in FIG. 9B, a conductivity-type conversion occurred over a region extending downward to within several thousandths of an inch of the first P-N junction 42 formed in the wafer. As shown in FIG. 9B, a plurality of P-N-P structures having two common conductivity-type regions 48 and 49 was produced.

In accordance with the teachings of Patent 2,802,760, other diffusants in addition to boron are also suitable. In general, a vapor of any significant N-type and P-type impurity which is masked appreciably by the surface oxide layer is advantageously utilized.

More complex structures of any shape or size are readily formed in accordance with the preceding process. For example, a structure having a plurality of P-N-P-N junctions is readily fabricated from the structure depicted in FIG. 9 by regrowing an oxide layer over the entire upper major face of the wafer, selectively etching the oxide layer, rinsing the face with water, and subsequently subjecting the wafer to another diffusion treatment. The wafer then undergoes final procession including removal of the remaining oxide layer and attachment of electrodes to the various conductivity-type regions.

While specific embodiments of the invention have been shown and described, it is understood that they are but illustrative, and that various modifications may be made therein without departing from the scope and spirit of the invention as defined by the appended claims.

What is claimed is:

1. Method of producing a semiconductor p-n junction device which comprises forming an oxide layer on at least one face of a silicon body, forming a solid alkali hydroxide pattern on selective portions of said oxide layer, said hydroxide being selected from the group consisting of sodium hydroxide, potassium hydroxide, rubidium hydroxide, and cesium hydroxide, heating said hydroxide and said oxide at a temperature below the melting point of said hydroxide to form a water-soluble silicate, washing said face with water to remove said silicate, exposing said face at an elevated temperature to a vapor of a conductivity type determining impuritiy to diffuse said impurity through only those surface portions of said face not covered by the oxide layer, and attaching electrodes to the various formed conductivity-type regions.

2. Method in accordance with claim 1 wherein said oxide layer is at least 1500 A. thick and said oxide and said hydroxide are reacted at a temperature of at least 90° C.

3. Method of treating a semiconductive silicon wafer by forming an oxide film on at least one face of said wafer, selectively removing said film from said face, and diffusing vapors of a conductivity-type determining impurity into the portions of said face not covered by the oxide film, wherein said film is removed from said face by a process comprising the steps of forming a solid alkali hydroxide pattern on selective portions of said film, said hydroxide being selected from the group consisting of sodium hydroxide, potassium hydroxide, rubidium hydroxide, and cesium hydroxide, reacting said hydroxide and said oxide at a temperature less than the melting point of said hydroxide to form a water-soluble silicate, and removing said silicate from the face of said wafer by rinsing the face with water.

4. A method in accordance with claim 3 wherein said hydroxide is sodium hydroxide.

5. A method in accordance with claim 3 wherein said hydroxide is potassium hydroxide.

6. A method in accordance with claim 3 wherein said hydroxide is rubidium hydroxide.

7. A method in accordance with claim 3 wherein said hydroxide is cesium hydroxide.

References Cited in the file of this patent

UNITED STATES PATENTS

| | | |
|---|---|---|
| Re. 21,703 | Burkhart et al. | Feb. 4, 1941 |
| 2,802,760 | Derick et al. | Aug. 13, 1957 |
| 2,977,228 | Gold et al. | Mar. 28, 1961 |

FOREIGN PATENTS

| | | |
|---|---|---|
| 159,900 | Australia | Nov. 22, 1954 |